(12) United States Patent
Reinmuth et al.

(10) Patent No.: US 8,749,250 B2
(45) Date of Patent: Jun. 10, 2014

(54) MICROMECHANICAL COMPONENT AND MANUFACTURING METHOD FOR A MICROMECHANICAL COMPONENT

(75) Inventors: Jochen Reinmuth, Reutlingen (DE); Gary O'Brien, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 480 days.

(21) Appl. No.: 13/207,822

(22) Filed: Aug. 11, 2011

(65) Prior Publication Data

US 2012/0038372 A1  Feb. 16, 2012

(30) Foreign Application Priority Data

Aug. 13, 2010  (DE) .................... 10 2010 039 293

(51) Int. Cl.
*G01R 27/26* (2006.01)
*G01P 15/125* (2006.01)

(52) U.S. Cl.
USPC .................... 324/661; 324/686; 73/514.32

(58) Field of Classification Search
USPC ................ 324/661, 686; 73/514.32
See application file for complete search history.

(56) References Cited

U.S. PATENT DOCUMENTS

2009/0314085 A1* 12/2009 Stahl et al. ................. 73/514.32
2010/0107762 A1*  5/2010 Classen et al. ............. 73/514.24

FOREIGN PATENT DOCUMENTS

DE   10 2008 043 788   5/2010
DE   10 2008 043 790   5/2010

* cited by examiner

*Primary Examiner* — Amy He
(74) *Attorney, Agent, or Firm* — Kenyon & Kenyon LLP (57) ABSTRACT

A micromechanical component is described having a substrate which has a movable mass which is connected via at least one spring to the substrate so that the movable mass is displaceable with respect to the substrate, and at least one fixedly mounted stator electrode. The movable mass and the at least one spring are structured from the substrate. At least one separating trench which at least partially surrounds the movable mass is formed in the substrate. The at least one stator electrode is situated adjacent to an outer surface of the movable mass which is at least partially surrounded by the separating trench, with the aid of at least one supporting connection which connects the at least one stator electrode to an anchor situated on the substrate and spans a section of the separating trench. Also described is a manufacturing method for a micromechanical component.

13 Claims, 8 Drawing Sheets

MICROMECHANICAL COMPONENT AND MANUFACTURING METHOD FOR A MICROMECHANICAL COMPONENT

RELATED APPLICATION INFORMATION

The present application claims priority to and the benefit of German patent application no. 10 2010 039 293.6, which was filed in Germany on Aug. 13, 2010, the disclosure of which is incorporated herein by reference.

FIELD OF THE INVENTION

The present invention relates to a micromechanical component. The present invention further relates to a sensor device. Moreover, the present invention relates to a manufacturing method for a micromechanical component and a manufacturing method for a sensor device.

BACKGROUND INFORMATION

German patent document DE 10 2008 043 790 A1 discusses a micromechanical component having a stator electrode situated on a substrate, and a centrifugal mass which is configured as an actuator electrode and is rotatably situated at a distance from the stator electrode. An insulating layer is deposited on the substrate during the manufacture of the micromechanical component. The at least one stator electrode is formed on the insulating layer. A sacrificial layer and a semiconductor layer such as an EPI polysilicon layer, for example, are subsequently deposited on the at least one actuator electrode. In a subsequent method step the centrifugal mass is structured from the semiconductor layer in the form of an asymmetrical rocker.

Also discussed in DE 10 2008 043 788 A1 is a micromechanical component having at least one stator electrode fixedly mounted on a substrate and a rotatably situated centrifugal mass, in the form of an asymmetrical rocker, which is situated at a distance from the stator electrode and structured from a semiconductor layer which is applied to the substrate, and configured as at least one actuator electrode.

SUMMARY OF THE INVENTION

The exemplary embodiments and/or exemplary methods of the present invention provides a micromechanical component having the features described herein, a sensor device having the features described herein, a manufacturing method for a micromechanical component having the features described herein, and a manufacturing method for a sensor device having the features described herein.

The exemplary embodiments and/or exemplary methods of the present invention ensures structuring of the movable mass and the at least one spring from the substrate. It is therefore not necessary to deposit/form an additional semiconductor layer on an insulating layer/sacrificial layer, formed on the substrate, from which the movable mass is formed in the related art. The problems which frequently occur in the manufacture of a silicon-on-insulator (SOI) configuration are thus eliminated using the technology according to the present invention. In addition, compared to the related art, work steps in the manufacturing method may be spared. The manufacturing costs for the micromechanical component according to the present invention may thus be reduced.

At the same time, the technology according to the present invention, described in greater detail below, ensures an option for manufacturing a micromechanical component having a mass which is movable with respect to a substrate and at least one stator electrode which is fixedly situated with respect to the substrate, the etching steps to be carried out for structuring the movable mass and the at least one spring from the substrate and the deposition steps/etching steps to be carried out for forming the at least one stator electrode needing to be performed only from one side of the substrate. In other words, only front-side processes are to be carried out for manufacturing the micromechanical component according to the present invention, while carrying out back-side processes is not necessary.

It is pointed out that in the technology according to the exemplary embodiments and/or exemplary methods of the present invention, the at least one stator electrode or the at least one metal printed conductor connected thereto is situated on the substrate in such a way that the mechanical properties of the at least one stator electrode or of the at least one metal printed conductor are able to cause little or no mechanical stresses in the substrate, in particular in the movable mass. It is therefore not necessary to structure the substrate, using a front-side and/or back-side etching process, in such a way that semiconductor webs are still formed under a MEMS metal layer (microsystem technology metal layer), which usually are to be formed with a greater width than the at least one metal printed conductor. This has the advantage that it is not necessary to carry out back-side processes for producing the supporting semiconductor webs.

With the aid of the exemplary embodiments and/or exemplary methods of the present invention, the known good mechanical and electrical properties of known MEMS sensors, in particular known MEMS sensors made of silicon, may be combined with the good properties of metal-based MEMS sensors without disadvantages. The disadvantages which often occur with such sensors do not have to be taken into account.

In the manufacturing method according to the present invention, described in greater detail below, the individual manufacturing steps of complementary metal oxide semiconductor (CMOS) manufacture and of MEMS manufacture may be carried out/may proceed separately from one another. Thus, the various processes do not influence one another. In particular, all method steps for manufacturing the MEMS structures may be carried out only after the actual CMOS manufacturing process.

The micromechanical component according to the present invention and the corresponding manufacturing method are particularly well suited for forming a sensor device. In one specific embodiment, the sensor devices may form an integrated evaluation circuit. For example, the evaluation circuit may be implemented as a CMOS circuit within a single chip together with the MEMS structures.

One advantageous specific embodiment of the sensor device according to the present invention is an acceleration sensor, with the aid of which an acceleration (of the acceleration sensor) having a component which is oriented perpendicularly to the area extension of the substrate and is not zero may be recognized/detected/measured. Such an acceleration sensor is frequently also referred to as a Z sensor. In particular, a Z sensor for very high capacitances and/or changes in capacitance may be manufactured with the aid of the technology according to the present invention.

It is pointed out that acceleration sensors which, as an alternative or supplement to the functionality of a Z sensor, are suited for recognizing/measuring an acceleration (of the acceleration sensor) in a direction parallel to the extension area of the substrate (X or XY acceleration sensors) may also be formed with the aid of the technology according to the present invention described herein.

However, the sensor device is not limited to a configuration as an acceleration sensor. For example, the sensor device may also be configured as a pressure sensor, whereby a change in pressure may result in an adjusting motion of the movable mass which is detectable with the aid of a capacitor, described in greater detail below.

In another specific embodiment it is possible to mount/provide a coil on the movable mass. In this case the micromechanical component according to the present invention may be used as a sensitive element of a magnetic field sensor. When a magnetic field strength changes over time due to an induced current flow through the coil, a deflection/adjusting motion of the movable mass occurs. A variable concerning the magnetic field strength may thus be identified/determined by a capacitive measurement, described in greater detail below.

However, the usability of the micromechanical component is not limited to an acceleration sensor, a pressure sensor, and/or a magnetic field sensor.

Further features and advantages of the exemplary embodiments and/or exemplary methods of the present invention are explained below with reference to the figures.

BRIEF DESCRIPTION OF THE DRAWINGS

FIGS. 2A, 2B, 2Ca and 2Cb show top views of various layers of one specific embodiment of the micromechanical component; FIG. 2Cb shows an enlarged partial region of FIG. 2Ca.

DETAILED DESCRIPTION

FIGS. 1A through 1G show cross sections of a semiconductor substrate for illustrating one specific embodiment of the manufacturing method.

In the manufacturing method schematically shown here, a micromechanical component having at least one actuator electrode 10 is formed. However, the manufacturing method described here is not limited to providing the micromechanical component with at least one actuator electrode 10. Instead of the at least one actuator electrode 10, a subregion of the movable mass may be configured as a counter electrode for the stator electrode, described in greater detail below.

The at least one actuator electrode 10 may be formed on a semiconductor substrate 12 which is still unstructured. As explained in greater detail below, in this case the at least one actuator electrode 10 may be used as part of an etching mask for subsequent structuring of semiconductor substrate 12. Semiconductor substrate 12 may be a silicon substrate, for example. Instead of or in addition to silicon, however, semiconductor substrate 12 may include another semiconductor material.

Semiconductor substrate 12 may be a CMOS wafer. Regions of semiconductor substrate 12 which are not needed as MEMS structures, such as a CMOS circuit region, may be covered by a protective layer while carrying out the manufacturing method described below. This layer may be removed after the manufacturing method, or if necessary may be renewed during the manufacturing method.

The at least one actuator electrode 10 is advantageously formed on an outer surface 14 of the movable mass which is structured from semiconductor substrate 12 in a subsequent method step. The formation of the at least one actuator electrode 10 may include, for example, depositing at least one metal-containing layer and structuring/etching the at least one deposited layer into the shape of at least of the at least one actuator electrode 10. Likewise, at least a partial surface of outer surface 14 may be made conductive by doping.

Optionally, at least a portion of outer surface 14 is covered with at least one insulating layer 16 before forming the at least one actuator electrode 10. In this case, the at least one actuator electrode 10 is formed on the at least one insulating layer 16. The at least one insulating layer 16 may be used to form electrical insulation between the movable mass, subsequently structured from semiconductor substrate 12, and the at least one actuator electrode 10 situated thereon. Likewise, the at least one insulating layer 16 may be used as a protective layer during the formation of the at least one actuator electrode 10 and the subsequent method steps. The at least one insulating layer 16 may be an oxide layer, for example. In particular, the at least one insulating layer 16 may be easily formed by thermal oxidation of at least a portion of outer surface 14 made of silicon.

Figure 1A:
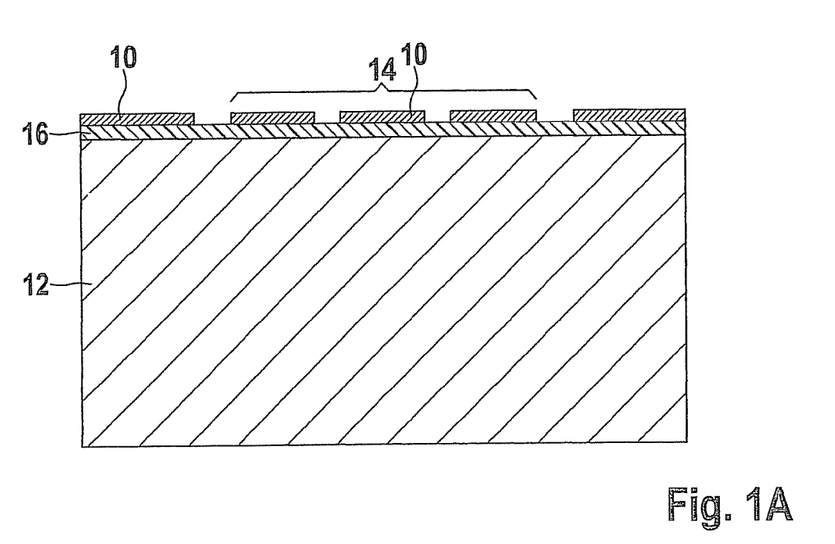
FIGS. 1A, 1B, 1C, 1D, 1E, 1F and 1G show cross sections of a semiconductor substrate for illustrating one specific embodiment of the manufacturing method.

FIG. 1A shows a cross section of semiconductor substrate 12 after formation of the at least one actuator electrode 10. At the same time that the at least one actuator electrode 10 is formed, at least one printed conductor (not illustrated) which connects the at least one actuator electrode to a subsequently produced sensor device and/or evaluation device may also be formed. An advantageous shape of the at least one actuator electrode 10 and/or of the at least one printed conductor situated thereon is discussed in the description of one specific embodiment of the micromechanical component.

A sacrificial layer 18 is formed on exposed surfaces of the at least one actuator electrode 10 and the at least one insulating layer 16 in a further method step. This may also be referred to as at least partial coverage of insulating layer 16 and/or of the at least one actuator electrode 10 with sacrificial layer 18. Sacrificial layer 18 may include an oxide, in particular silicon oxide.

At least one recess for exposing a contact surface 20 of the at least one actuator electrode 10 may be subsequently etched through sacrificial layer 18. The at least one recess may be filled with a conductive material, for example tungsten or aluminum, to form at least one contact 22. The at least one actuator electrode may be subsequently contacted via the at least one contact 22 for tapping a voltage.

Figure 1B:
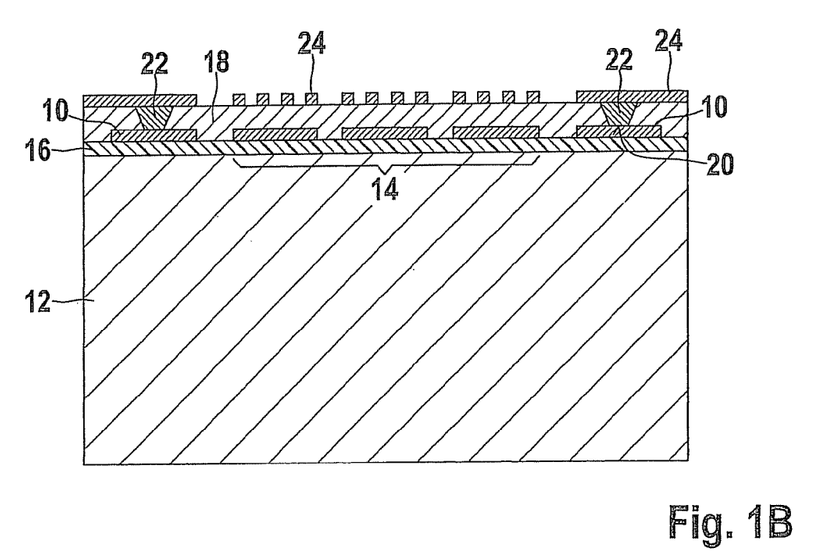

As shown in FIG. 1B, after the at least one contact 22 is formed at least one stator electrode 24 is formed on an exposed surface of sacrificial layer 18. For this purpose, at least one conductive layer, which may include a metal, may be deposited on sacrificial layer 18 and structured/etched into a desired shape. In addition, at least one supporting connection (not illustrated) and at least one anchor (not illustrated) may be formed on sacrificial layer 18 from the at least one conductive layer. The function of the supporting connection is described in greater detail below. In addition, an advantageous shape of the at least one stator electrode 24, of the at least one supporting connection, and of the at least one anchor is described in greater detail below. In particular, the shape of the at least one stator electrode 24, of the at least one supporting connection, and/or of the at least one anchor may be selected to be usable as a suitable portion of an etching mask for the etching steps described below.

Figure 1C:
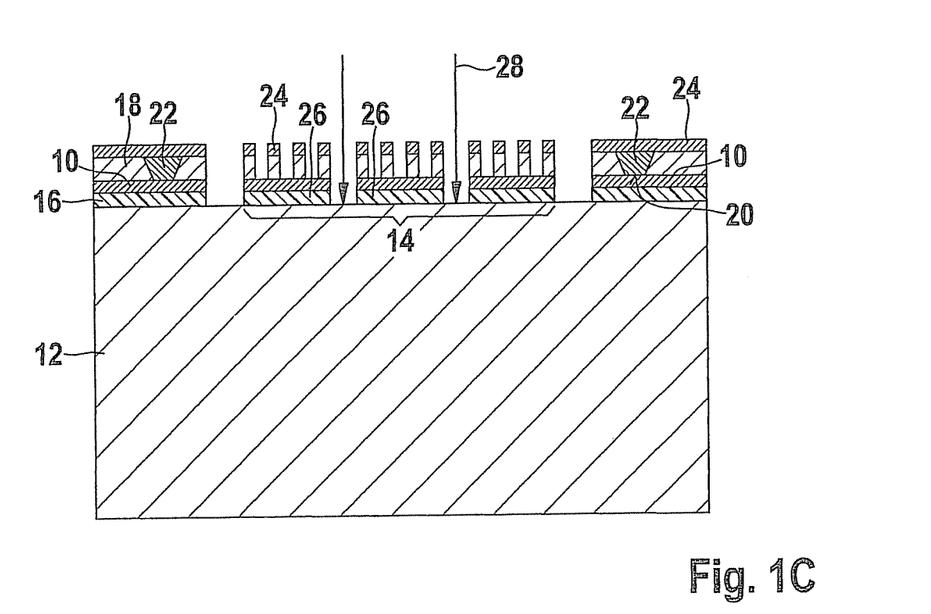

In a subsequent first etching step illustrated in FIG. 1C, at least the regions of sacrificial layer 18 not covered by the at least one stator electrode 24, by the at least one supporting connection, and by the at least one anchor, and the regions of insulating layer 16 which are exposed and not covered by the at least one actuator electrode 10 are at least partially removed. This may be achieved using the at least one stator electrode 24 and/or portions of the at least one actuator electrode 10 as a mask.

The first etching step may be an anisotropic plasma etching step, for example. An etching material which etches layers 16 and 18 but which does not attack the materials of electrodes 10 and 24 and of semiconductor substrate 12 may be used for the first etching step. The at least one stator electrode 24 may have a finely perforated configuration to assist in the first etching step. In contrast, a less finely perforated configuration may be used for the at least one actuator electrode 10. It may thus be ensured that insulation 26 from the at least one insulating layer 16 still remains despite partial removal of material of the at least one insulating layer 16 between the at least one actuator electrode 10 and semiconductor substrate 12 which is not etched in the first etching step.

The first etching step is carried out in an etching direction 28 which is directed from a top side of the at least one stator electrode 24 facing away from semiconductor substrate 12, toward the boundary surface of semiconductor substrate 12 which adjoins the at least one insulating layer 16.

Figure 1D:
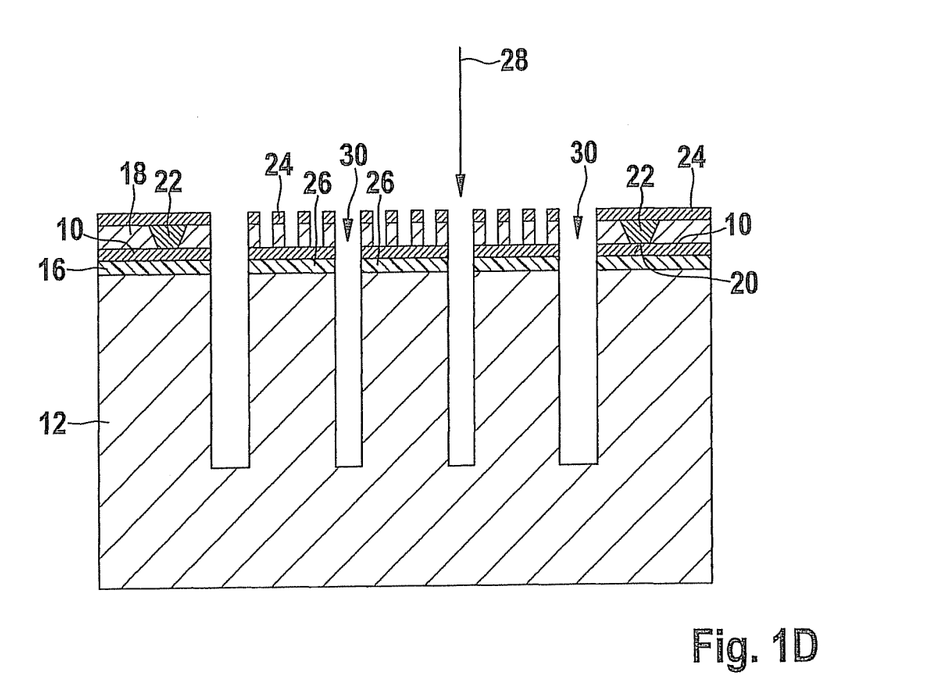

As shown in FIG. 1D, a trenching process is subsequently carried out in a second etching step, which is likewise aligned along etching direction 28. Electrodes 10 and 24 likewise may be used as a mask in the trenching process. An etching material which causes little or no attack on the materials of electrodes 10 and 24 and layers 16 and 18, but which etches at least one trench 30 in at least one region of semiconductor substrate 12 exposed in the first etching step may be used for the second etching step. $SF_6$ is one example of a suitable etching material for the second etching step.

The trenching process in the second etching step may be controlled in such a way that the connecting webs, described in greater detail below, via which the at least one stator electrode 24 is suspended above the movable mass which is subsequently completely structured from the semiconductor material, are at least partially, which may be completely, underetched. However, in the second etching step the material of semiconductor substrate 12 covered by the at least one actuator electrode 10 need not be etched.

Figure 1E:
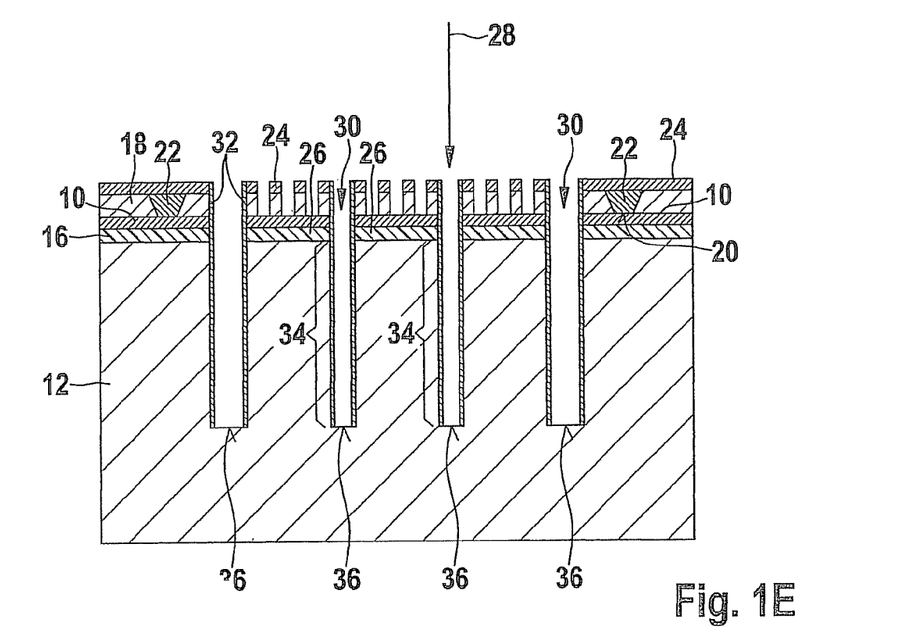

In a method step subsequent to the second etching process, side wall 34 of the at least one etched trench 30 is passivated. This may be achieved, for example, by a passivation step in the trenching process itself. As an alternative, after the at least one trench 30 is etched, as illustrated in FIG. 1E, at least one protective layer 32 may be formed in the at least one trench 30 in such a way that the at least one side wall 34 of the at least one trench 30 is covered by the at least one protective layer 32 (see FIG. 1E). Protective layer 32 may be a thin oxide layer, for example. An oxide material having a small layer thickness, for example, may be deposited to form a suitable oxide layer. Thermal oxidation may be carried out as an alternative to depositing the oxide material. The at least one base surface 36 of the at least one trench 30 which is etched into semiconductor substrate 12 may subsequently be opened/exposed, using an anisotropic etching step. The etching step for exposing the at least one base surface 36 may be carried out along etching direction 28.

Figure 1F:
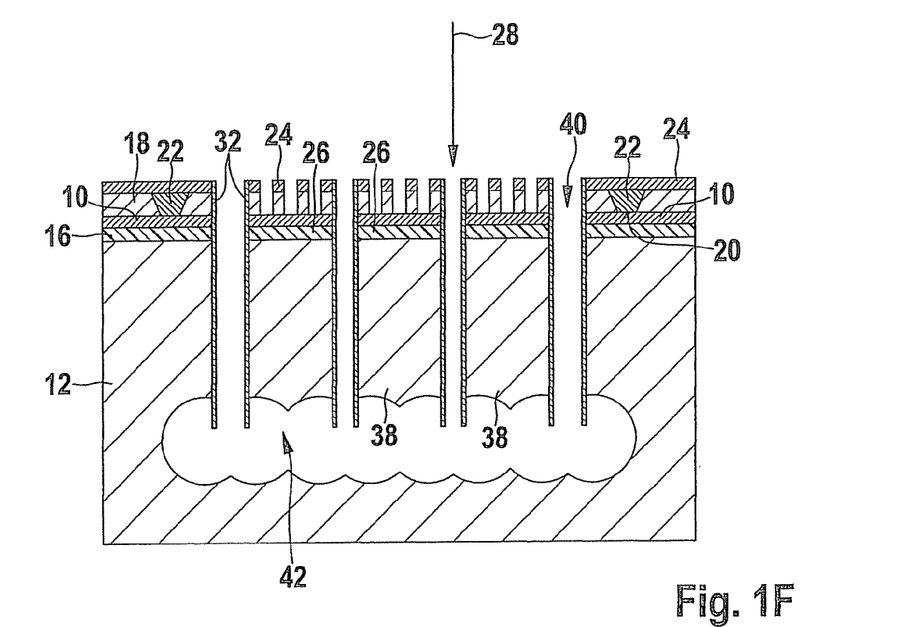

FIG. 1F shows an isotropic third etching step, carried out from etching direction 28, with the aid of which movable mass 38 and at least one spring (not illustrated) are structured from semiconductor substrate 12 in such a way that movable mass 38 is connected to semiconductor substrate 12 (residual substrate) via the spring. The isotropic third etching step illustrated in FIG. 1F may also be described such that movable mass 38 is released with respect to semiconductor substrate 12 (residual substrate). Movable mass 38, which is connected to semiconductor substrate 12 via the spring, is displaceable with respect to semiconductor substrate 12 at least from a first position to a second position. One example of an advantageous adjustment option of movable mass 38 as well as a particularly suitable shape of released movable mass 38 are described in greater detail below.

At least one separating trench 40 which at least partially surrounds movable mass 38 is formed in semiconductor substrate 12 in the second and third etching steps. A base trench 42 which separates an inner side of movable mass 38, which protrudes into semiconductor substrate 12, from semiconductor substrate 12 may also be formed.

The at least one stator electrode 24 remains fixedly mounted to the semiconductor substrate. This is ensured by the at least one supporting connection which connects the at least one stator electrode 24 to the anchor situated on semiconductor substrate 12, spans a section of separating trench 40, and situates/fixes the at least one stator electrode 24 adjacent to outer surface 14 of movable mass 38 which is at least partially surrounded by separating trench 42. The at least one actuator electrode 10 may be situated on outer surface 14 of movable mass 38.

Figure 1G:
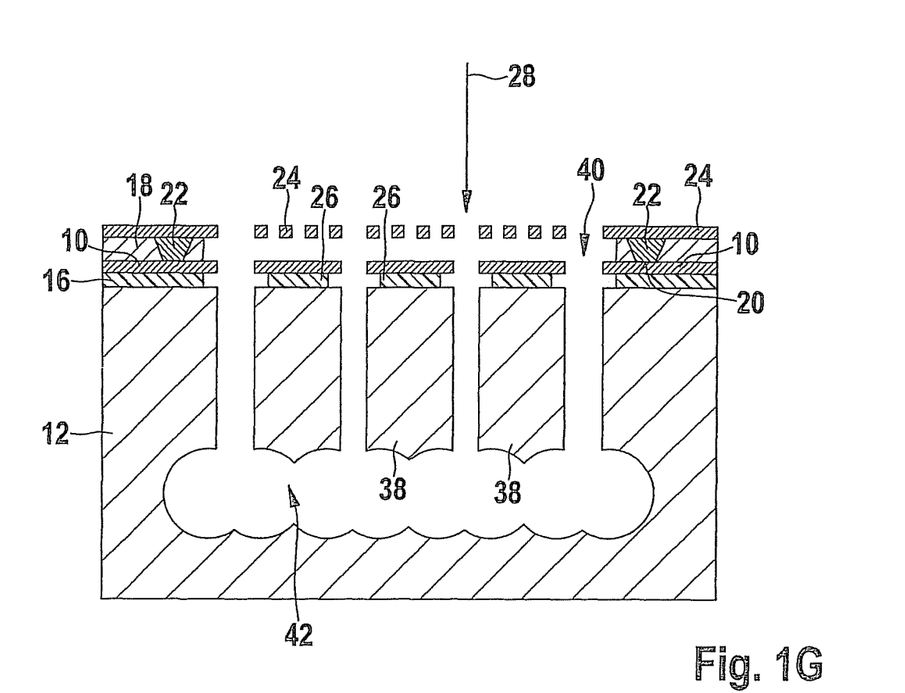

Protruding subregions/residues of protective layer 32 and/or of sacrificial layer 18 may be removed in a final isotropic etching step which is illustrated in FIG. 1G. For this purpose, for example a plasma etching step guided from etching direction 28 may be carried out, using a $C_xF_yH_z$ compound in combination with a carrier gas and oxygen. Such a plasma etching step may be carried out at a comparatively high pressure. Advantageous isotropic etching behavior is thus ensured, the materials of layers 18 and 32 being etched in a targeted manner. Of course, with the aid of an isotropic oxide etching step, the residues of sacrificial layer 18 may also be removed after etching the at least one trench 30. When the side wall passivation is appropriately selected, the etching step illustrated in FIG. 1G may thus be dispensed with altogether.

With the aid of fine perforation of the at least one stator electrode 24, it may also be ensured that even a brief duration of this final isotropic etching step is sufficient for releasing movable mass 38 and the at least one actuator electrode 10. However, if an HF gas phase etching step, which has different etching rates for different oxides, is carried out to release the at least one stator electrode 24, the fine perforation may also be dispensed with. For example, an oxide doped with phosphorus may be used for the at least one sacrificial layer 18, while a thermal oxide as insulating layer 16 is formed between semiconductor substrate 12 and the at least one actuator electrode 10. In this case, sacrificial layer 18 may be selectively removed due to the etching rate of the doped oxide, which is more than ten times higher.

It is pointed out that the manufacturing method described here is strictly a front-side process. Complicated back-side process steps are not necessary for carrying out the manufacturing method. Similarly, there is no need to protect structures, in particular sensor structures, from the back side in the manufacturing method.

Figure 2:
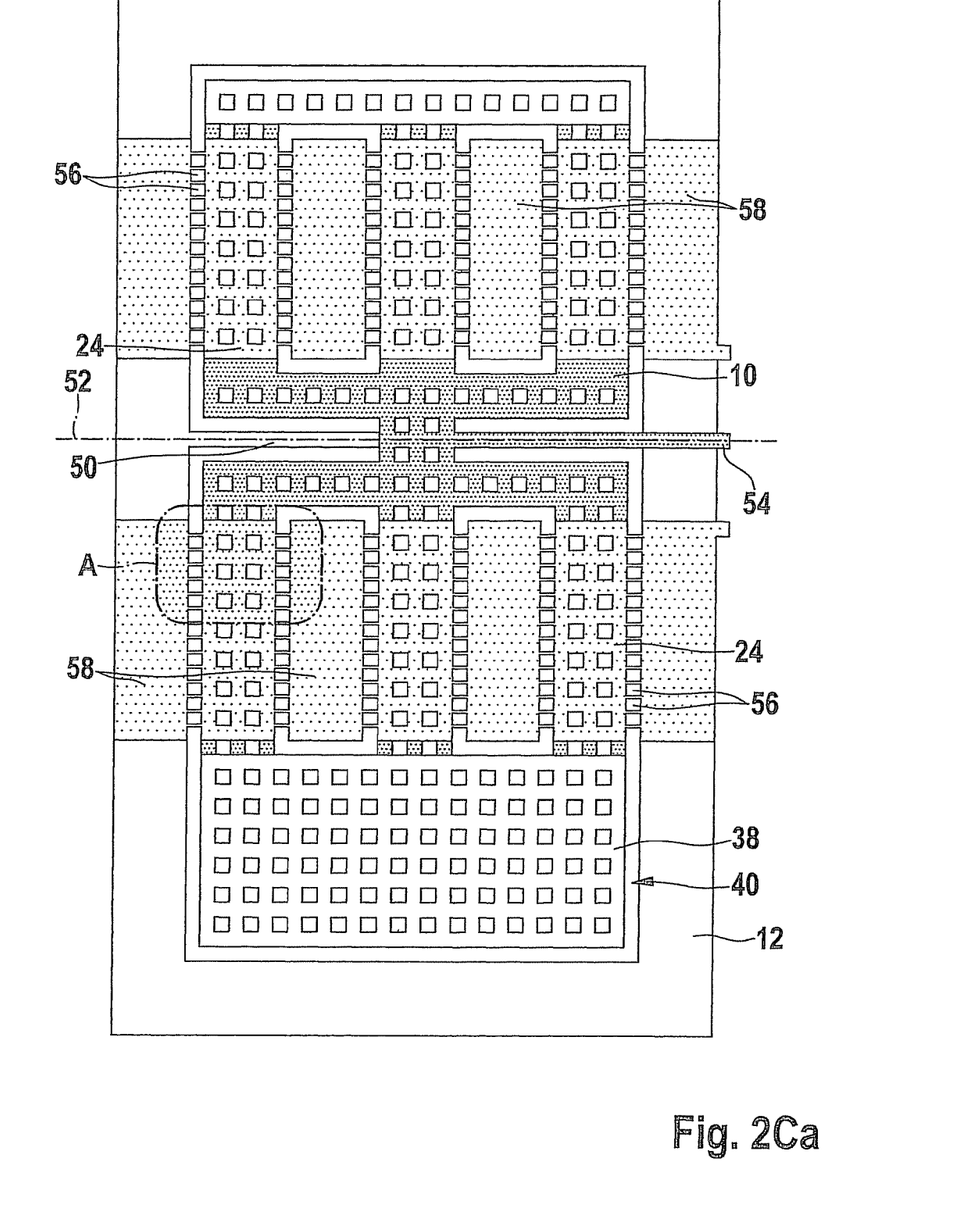
Figure 2A:
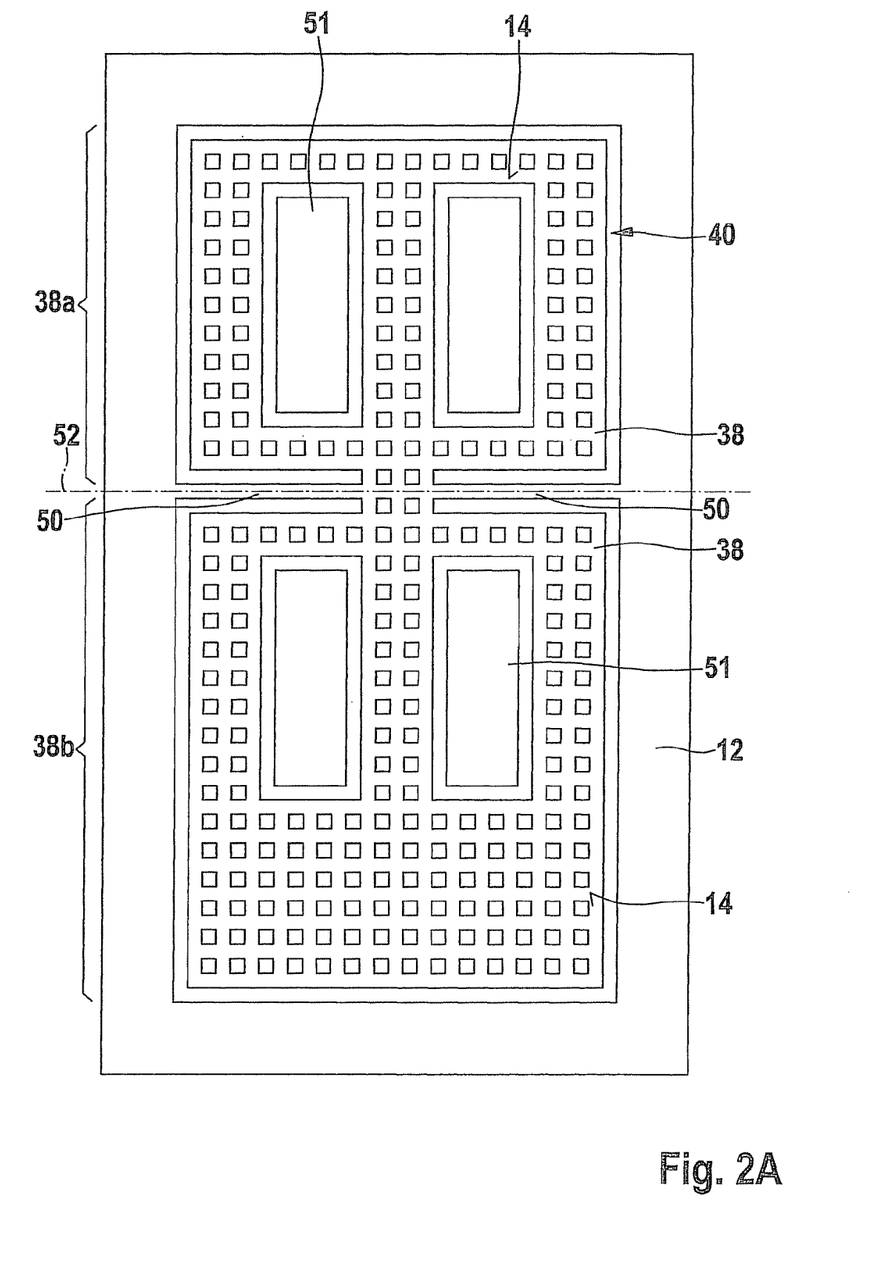
Figure 2B:
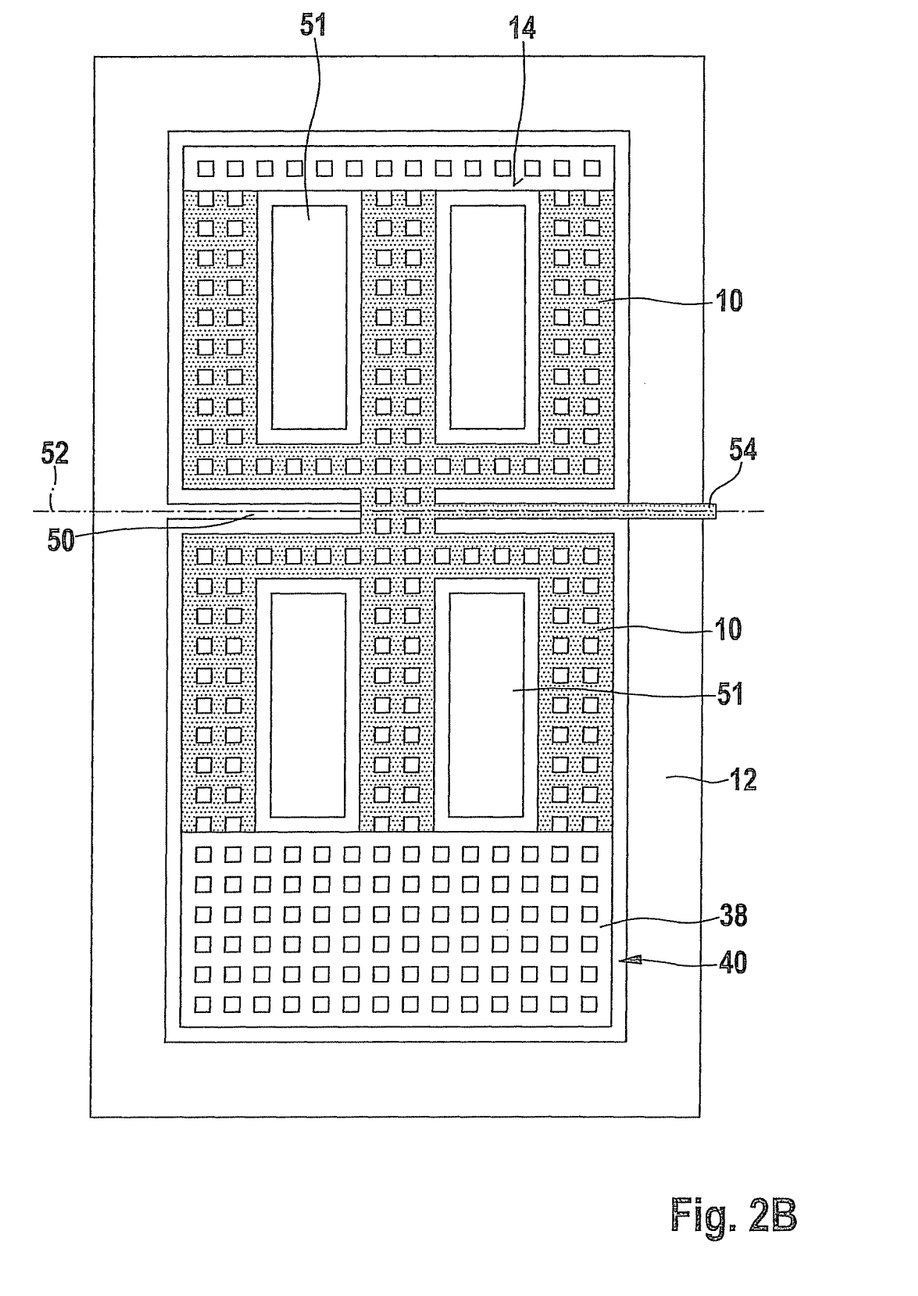

FIGS. 2A through 2C show top views of various layers of one specific embodiment of the micromechanical component; FIG. 2Cb shows an enlarged partial region of FIG. 2Ca.

The micromechanical component described below may be manufactured, for example, using the manufacturing method discussed above. However, the manufacture of the micromechanical component is not limited to the description of the above-described manufacturing method.

FIG. 2A schematically illustrates a top view of a first layer of semiconductor substrate 12 together with movable mass 38 which is structured from semiconductor substrate 12. Movable mass 38 is connected via at least one spring 50 to semiconductor substrate 12 in such a way that movable mass 38 is displaceable with respect to semiconductor substrate 12 at least from a first position to a second position. Movable mass 38 and the at least one spring 50 are structured from semiconductor substrate 12, at least one separating trench 40 which at least partially surrounds movable mass 38 being formed in the substrate. The one outer surface 14 of the separating trench 40 which at least partially surrounds the movable mass may have a width between 0.5 μm and 20 μm. In addition to separating trench 40 which at least partially surrounds movable mass 38 in a surface parallel to the extension of semiconductor substrate 12, a base trench (not illustrated) may be formed between an inner side of movable mass 38, which protrudes into semiconductor substrate 12, and semiconductor substrate 12. Movable mass 38 may surround at least one support post 51 which is fixedly connected to semiconductor substrate 12, the use of which is described in greater detail below.

In the illustrated specific embodiment, movable mass 38 is configured as a rocker having an asymmetrical distribution of mass. Movable mass 38 is displaceable with respect to semiconductor substrate 12 about a rotational axis 52 which extends along the at least one spring 50, the rotational axis 52 dividing movable mass 38 into a first partial mass 38a and a second partial mass 38b. First partial mass 38a has a first weight which is less than a second weight of second partial mass 38b. Due to the heavier configuration of second partial mass 38b compared to first partial mass 38a, an acceleration of the micromechanical component having a component, which is not zero, oriented perpendicularly to semiconductor substrate 12 causes a tilting motion of displaceable mass 38 about rotational axis 52. This tilting motion of movable mass 38 may be detected with the aid of the electrodes, which are described in greater detail below.

FIG. 2B shows a top view of a second layer of semiconductor substrate 12 together with the at least one actuator electrode 10 situated on outer side 14 of movable mass 38. The at least one actuator electrode 10 may be contacted via at least one printed conductor 54 provided on the at least one spring 50. Perforations which contribute to improved compensation of stress and simplify the underetching of the at least one actuator electrode 10 may be provided in the at least one actuator electrode 10. The at least one actuator electrode 10 is situated on movable mass 38 in such a way that the position of the actuator electrode changes in relation to semiconductor substrate 12 during the tilting motion of movable mass 38. In the configuration of movable mass 38 described above, a first actuator electrode 10 may be situated on first partial mass 38a, and a second actuator electrode 10 may be situated on second partial mass 38b.

FIG. 2Ca illustrates a top view of a third layer of semiconductor substrate 12, together with the at least one stator electrode 24 situated adjacent to the at least one actuator electrode 10. Perforations which contribute to improved compensation of stress and simplify the underetching of the at least one stator electrode 24 may also be provided in the at least one stator electrode 24. With the aid of at least one supporting connection 56 which connects the at least one stator electrode 24 to an anchor 58 which is situated on semiconductor substrate 12 and which spans a section of separating trench 40, the at least one stator electrode 24 is situated adjacent to outer surface 14 of movable mass 38 which is at least partially surrounded by separating trench 40. The at least one anchor 58 may be situated on a support post, for example. Reliable holding of the at least one stator electrode 24 is easily achievable in this way.

The at least one stator electrode 24 is attached to semiconductor substrate 12 in such a way that there is little or no change in the position of the stator electrode in relation to the semiconductor substrate during the tilting motion of movable mass 38. In particular, multiple stator electrodes 24, for example three stator electrodes 24, may be associated with an actuator electrode 10. For such a multiple association of stator electrodes 24 with an actuator electrode 10, good measuring accuracy with low error variance is ensured, even when stator electrodes 24 are configured with a small surface area. In addition, the small-surface configuration of individual stator electrodes 24 allows the advantageous suspension with the aid of multiple comparatively thin supporting connections 56, as described in greater detail below.

The rotational motion/tilting motion of movable mass 38 about rotational axis 52 causes a change in distance between the at least one actuator electrode 10 and at least one stator electrode 24 which is mounted adjacent to the at least one actuator electrode 10. Thus, a deflection of movable mass 38, which is configured as an asymmetrical rocker, due to an acceleration having a component, which is not zero, perpendicular to semiconductor substrate 12 may be recognized/measured via a change in capacitance of at least one capacitor which is formed from electrodes 10 and 24. In particular, for a system of two actuator electrodes 10 on movable mass 38, a difference between the capacitance of a capacitor formed from first actuator electrode 10 and at least one associated first stator electrode 24 and a capacitance of a capacitor formed from second actuator electrode 10 and at least one associated second stator electrode 24 may be evaluated for recognizing/measuring the acceleration component perpendicular to semiconductor substrate 12. For this purpose, in particular at least one integrated sensor device and/or evaluation device may be provided in and/or on semiconductor substrate 12. Since methods for identifying an acceleration based on such a change in capacitance are known, they are not described in greater detail here.

FIG. 2Cb shows an enlarged partial detail A of FIG. 2Ca. As is apparent in FIG. 2Cb, each of stator electrodes 24 is suspended adjacent to outer side 14 of movable mass 38 via multiple supporting connections 56. It is pointed out once again that each of stator electrodes 24 may be connected to semiconductor substrate 12, with the aid of supporting connections 56, in such a way that the stator electrode is not movable together with movable mass 38. This connection may be achieved via supporting connections 56, which for a narrow configuration of separating trench 40 only need to span small distances.

Supporting connections 56 may have a length between 0.5 μm and 30 μm, and a width between 0.1 μm and 3 μm. Particularly advantageous stability of supporting connections 56 may be achieved in particular when the at least one stator electrode 10 and supporting connections 56 associated therewith are structured, at least partially, from multiple metal layers which may contain oxides.

The different mechanical properties, such as the different thermal expansions, of the semiconductor material of semiconductor substrate 12 and of the at least one material of the at least one stator electrode 24 and of the at least one supporting connection 56 may be compensated for via supporting connections 56. This is ensured in particular when supporting connections 56, as illustrated in FIG. 2Cb, have an angled configuration. An angled configuration of a supporting connection 56 is understood to mean that supporting connection 56 is oriented at a nonperpendicular angle (an angle≠90°) relative to a center longitudinal axis 60 of section 62 of separating trench 40 which is spanned by supporting connection 56. Such an angled configuration of supporting connection 56 may result in improved stress compensation. The advantage of improved stress compensation is also achieved when the at least one supporting connection 56 has a curved shape (not illustrated).

FIG. 2Cb also shows an interruption 64 which is provided in a stator electrode 24. Additional stress compensation is easily achievable with the aid of such an interruption 64 provided in at least one stator electrode 24 and/or one actuator electrode 10.

The micromechanical component described in the preceding paragraphs may be used in a sensor device. Use of the micromechanical component is not limited to an acceleration sensor. Rather, the micromechanical component may also be used in a magnetic field sensor or in a pressure sensor.

In this case, the sensor device includes an evaluation device which is configured to ascertain a variable with regard to a capacitance of at least one capacitor formed from the at least one stator electrode 24 and the at least one actuator electrode 10 (or a doped surface of outer surface 14), and to determine and output information concerning an acceleration exerted on movable mass 38, a pressure exerted on movable mass 38, and/or a magnetic field in a region of a coil situated on movable mass 38, taking the ascertained variable into account. In particular, the evaluation device may be configured as an integrated circuit in and/or on semiconductor substrate 12.

What is claimed is:

1. A micromechanical component, comprising:
   a substrate having a movable mass which is connected via at least one spring to the substrate so that the movable mass is displaceable with respect to the substrate at least from a first position to a second position; and
   at least one stator electrode which is fixedly situated with respect to the substrate;
   wherein the movable mass and the at least one spring are structured from the substrate, at least one separating trench which at least partially surrounds the movable mass being formed in the substrate, and
   wherein the at least one stator electrode is situated adjacent to an outer surface of the movable mass which is at least partially surrounded by the separating trench with the aid of at least one supporting connection which connects the at least one stator electrode to an anchor situated on the substrate and spans a section of the separating trench.

2. The micromechanical component of claim 1, wherein the micromechanical component includes at least one actuator electrode which is situated on the outer surface of the movable mass.

3. The micromechanical component of claim 1, wherein at least one of at least one integrated sensor device and an evaluation device is provided at least one of in and on the substrate.

4. The micromechanical component of claim 1, wherein the at least one supporting connection has a length between 0.5 µm and 30 µm and a width between 0.1 µm and 3 µm.

5. The micromechanical component of claim 1, wherein the at least one supporting connection is oriented at a nonperpendicular angle relative to a center longitudinal axis of the section of the separating trench which is spanned by the supporting connection.

6. The micromechanical component of claim 1, wherein the at least one supporting connection has a curved shape.

7. The micromechanical component of claim 1, wherein the movable mass is tiltable with respect to the substrate about a rotational axis which extends along the at least one spring, and the rotational axis divides the movable mass into a first partial mass having a first weight, and a second partial mass having a second weight which is greater than the first weight.

8. A sensor device, comprising:
   a micromechanical component, including:
      a substrate having a movable mass which is connected via at least one spring to the substrate so that the movable mass is displaceable with respect to the substrate at least from a first position to a second position; and
      at least one stator electrode which is fixedly situated with respect to the substrate;
      wherein the movable mass and the at least one spring are structured from the substrate, at least one separating trench which at least partially surrounds the movable mass being formed in the substrate, and
      wherein the at least one stator electrode is situated adjacent to an outer surface of the movable mass which is at least partially surrounded by the separating trench with the aid of at least one supporting connection which connects the at least one stator electrode to an anchor situated on the substrate and spans a section of the separating trench; and
   an evaluation device to ascertain a variable with regard to a capacitance of at least one capacitor formed from the at least one stator electrode and the at least one actuator electrode or a doped surface of the outer surface, and to determine and output information concerning at least one of an acceleration exerted on the movable mass, a pressure exerted on the movable mass, and a magnetic field in a region of a coil situated on the movable mass, taking the ascertained variable into account.

9. The sensor device of claim 8, wherein the evaluation device is configured as an integrated circuit at least one of in and on the substrate.

10. A manufacturing method for a micromechanical component, the method comprising:
   connecting a movable mass via at least one spring to a substrate so that the movable mass is displaceable with respect to the substrate at least from a first position to a second position; and
   fixedly mounting at least one stator electrode to the substrate;
   wherein for connecting the movable mass to the substrate, the movable mass and the at least one spring are structured from the substrate, at least one separating trench which at least partially surrounds the movable mass being formed in the substrate, and
   wherein for fixedly mounting the at least one stator electrode to the substrate, at least one supporting connection is formed and connects the at least one stator electrode to an anchor which is situated on the substrate and spans a section of the separating trench, and with the aid of the at least one supporting connection the at least one stator electrode is situated adjacent to an outer surface of the movable mass which is at least partially surrounded by the separating trench.

11. The manufacturing method of claim 10, wherein the least one actuator electrode is situated on the outer surface of the movable mass.

12. The manufacturing method of claim 11, further comprising:

at least partially covering the outer surface of the movable mass, which is subsequently structured from the substrate, with an insulating layer;

forming the at least one actuator electrode on the insulating layer;

at least partially covering at least one of the insulating layer and the at least one actuator electrode with a sacrificial layer;

forming the at least one stator electrode, the at least one supporting connection, and the at least one anchor on the sacrificial layer;

performing a first etching step to remove the regions of the sacrificial layer not covered by the at least one stator electrode, by the at least one supporting connection, and by the at least one anchor, and to remove the exposed regions of the insulating layer not covered by the at least one actuator electrode;

forming a second etching step to form at least one trench in at least one region of the substrate exposed in the first etching step;

forming at least one protective layer in the at least one formed trench, the at least one side wall of the at least one trench being covered by the at least one protective layer, and the at least one protective layer being removed from the at least one base surface of the at least one trench; and performing an isotropic third etching step so that the movable mass and the at least one spring are structured from the substrate.

13. A manufacturing method for a sensor device, the method comprising:

making a micromechanical component by performing the following:

connecting a movable mass via at least one spring to a substrate so that the movable mass is displaceable with respect to the substrate at least from a first position to a second position; and fixedly mounting at least one stator electrode to the substrate;

wherein for connecting the movable mass to the substrate, the movable mass and the at least one spring are structured from the substrate, at least one separating trench which at least partially surrounds the movable mass being formed in the substrate, and wherein for fixedly mounting the at least one stator electrode to the substrate, at least one supporting connection is formed and connects the at least one stator electrode to an anchor which is situated on the substrate and spans a section of the separating trench, and with the aid of the at least one supporting connection the at least one stator electrode is situated adjacent to an outer surface of the movable mass which is at least partially surrounded by the separating trench; and providing an evaluation device which is configured, during subsequent operation of the sensor device, to ascertain a variable with regard to a capacitance of at least one capacitor which includes the at least one stator electrode and the at least one actuator electrode or a doped surface of the outer surface, and to determine and output information concerning at least one of an acceleration exerted on the movable mass, a pressure exerted on the movable mass, and a magnetic field in a region of a coil situated on the movable mass, taking the ascertained variable into account.

* * * * *